(12) United States Patent
Hoshi

(10) Patent No.: US 8,908,361 B2
(45) Date of Patent: Dec. 9, 2014

(54) ELECTRONIC APPARATUS

(71) Applicant: Fujitsu Limited, Kawasaki-shi (JP)

(72) Inventor: Masahiko Hoshi, Katsushika (JP)

(73) Assignee: Fujitsu Limited, Kawasaki (JP)

( * ) Notice: Subject to any disclaimer, the term of this patent is extended or adjusted under 35 U.S.C. 154(b) by 184 days.

(21) Appl. No.: 13/754,763

(22) Filed: Jan. 30, 2013

(65) Prior Publication Data

US 2013/0258572 A1    Oct. 3, 2013

(30) Foreign Application Priority Data

Mar. 27, 2012    (JP) ................................ 2012-071796

(51) Int. Cl.
- *G06F 1/16* (2006.01)
- *G06F 1/18* (2006.01)
- *H05K 5/03* (2006.01)

(52) U.S. Cl.
CPC ...... *G06F 1/181* (2013.01); *H05K 5/03* (2013.01); *G06F 1/1601* (2013.01)
USPC .................................................. 361/679.08

(58) Field of Classification Search
USPC ........................ 361/679.08, 679.01
See application file for complete search history.

(56) References Cited

U.S. PATENT DOCUMENTS

| | | | | |
|---|---|---|---|---|
| 5,819,163 | A * | 10/1998 | Tsukamoto et al. | 455/575.1 |
| 6,751,089 | B2 * | 6/2004 | Hsieh | 361/679.09 |
| 8,564,940 | B2 * | 10/2013 | Yang | 361/679.08 |
| 2008/0304214 | A1 * | 12/2008 | Nakajima | 361/680 |

FOREIGN PATENT DOCUMENTS

| | | |
|---|---|---|
| JP | 61-53830 | 4/1986 |
| JP | 4-85290 | 7/1992 |
| JP | 5-118293 | 5/1993 |

* cited by examiner

*Primary Examiner* — Lisa Lea Edmonds
(74) *Attorney, Agent, or Firm* — Fujitsu Patent Center

(57) ABSTRACT

An electronic apparatus includes: a casing that is formed by press molding and that has positioning holes; a first assembly having positioning projections that are inserted into the positioning holes and at whose distal ends are provided buffer portions that project-out from the positioning holes, the first assembly being assembled to an inner side of the casing in a positioned state due to the positioning projections being inserted into the positioning holes; and a second assembly having engaging portions, and being assembled to the inner side of the casing in a state of being positioned at the first assembly, due to the engaging portions being engaged with engaged portions that are formed at the first assembly.

8 Claims, 16 Drawing Sheets

ELECTRONIC APPARATUS

CROSS-REFERENCE TO RELATED APPLICATION

This application is based upon and claims the benefit of priority of the prior Japanese Patent Application No. 2012-071796, filed on Mar. 27, 2012, the entire contents of which are incorporated herein by reference.

FIELD

The embodiments discussed herein are related to an electronic apparatus.

BACKGROUND

There are conventionally known apparatuses having a casing, and an assembly that is assembled to the inner side of the casing in a state of being positioned thereat.

RELATED PATENT DOCUMENTS

Japanese Laid-open utility model publication No. 61-53830
Japanese Laid-open patent publication No. 5-118293
Japanese Laid-open utility model publication No. 4-85290

SUMMARY

According to an aspect of the embodiments, an apparatus includes: a casing that is formed by press molding and that has positioning holes; a first assembly having positioning projections that are inserted into the positioning holes and at whose distal ends are provided buffer portions that project-out from the positioning holes, the first assembly being assembled to an inner side of the casing in a positioned state due to the positioning projections being inserted into the positioning holes; and a second assembly having engaging portions, and being assembled to the inner side of the casing in a state of being positioned at the first assembly, due to the engaging portions being engaged with engaged portions that are formed at the first assembly.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An embodiment of the technique disclosed in the present application is described hereinafter with reference to the drawings.

Note that arrow X, arrow Y and arrow Z that are illustrated in the respective drawings indicate the left side when facing an electronic apparatus 10, the near side (the side toward the operator) of the electronic apparatus 10, and the upper side of the electronic apparatus 10, respectively.

Figure 1:
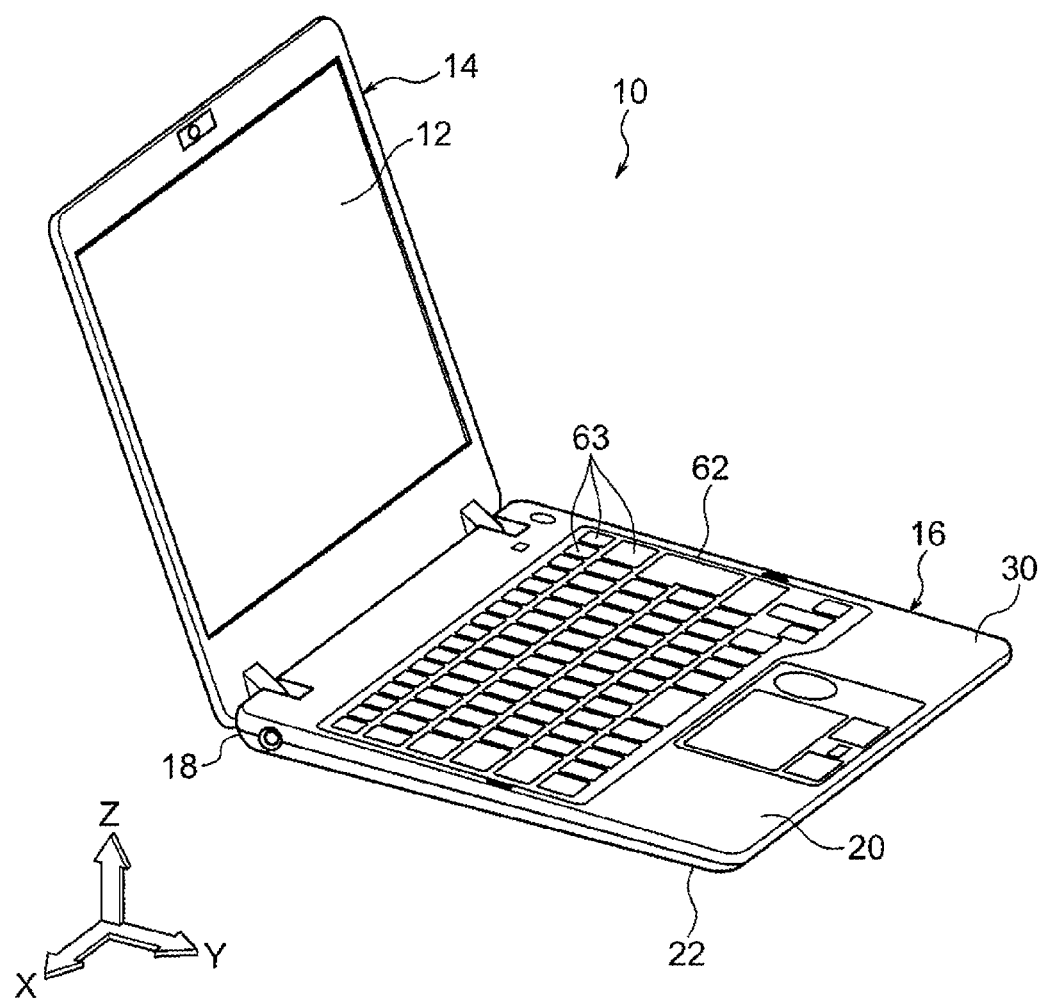
FIG. 1 is a perspective view of an electronic apparatus.

As illustrated in FIG. 1, the electronic apparatus 10 relating to the present embodiment is, as an example, a notebook personal computer. The electronic apparatus 10 has a display portion 14 having a monitor 12, and a main body portion 16 having a keyboard unit 62 that is described later.

The display portion 14 is mounted to a rear wall portion 18 of the main body portion 16, so as to be able to pivot via unillustrated hinges. The display portion 14 can be set in an unfolded state, in which the display portion 14 is made to stand upright with respect to the main body portion 16, and a stored state, in which the display portion 14 is folded-down so as to be superposed on the main body portion 16. The display portion 14 is illustrated in the unfolded state in FIG. 1.

The main body portion 16 has an upper cover assembly 20 and a lower cover 22. Apparatuses, such as electronic circuits for driving the monitor 12, a battery, storage devices (none of which are illustrated), and the like, are stored in the space that is formed between the upper cover assembly 20 and the lower cover 22.

Figure 2:
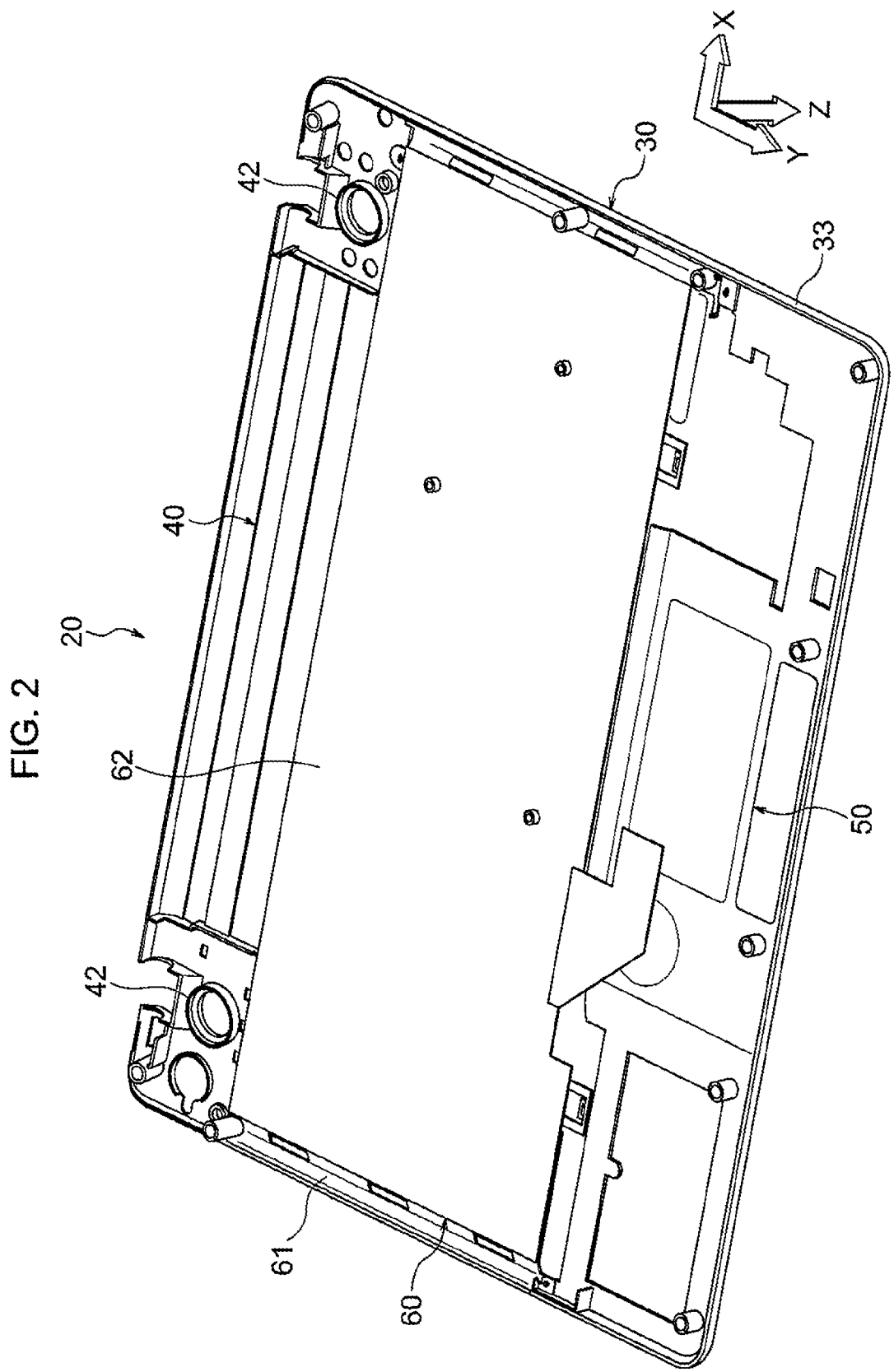
FIG. 2 is a perspective view of an upper cover assembly.
Figure 3:
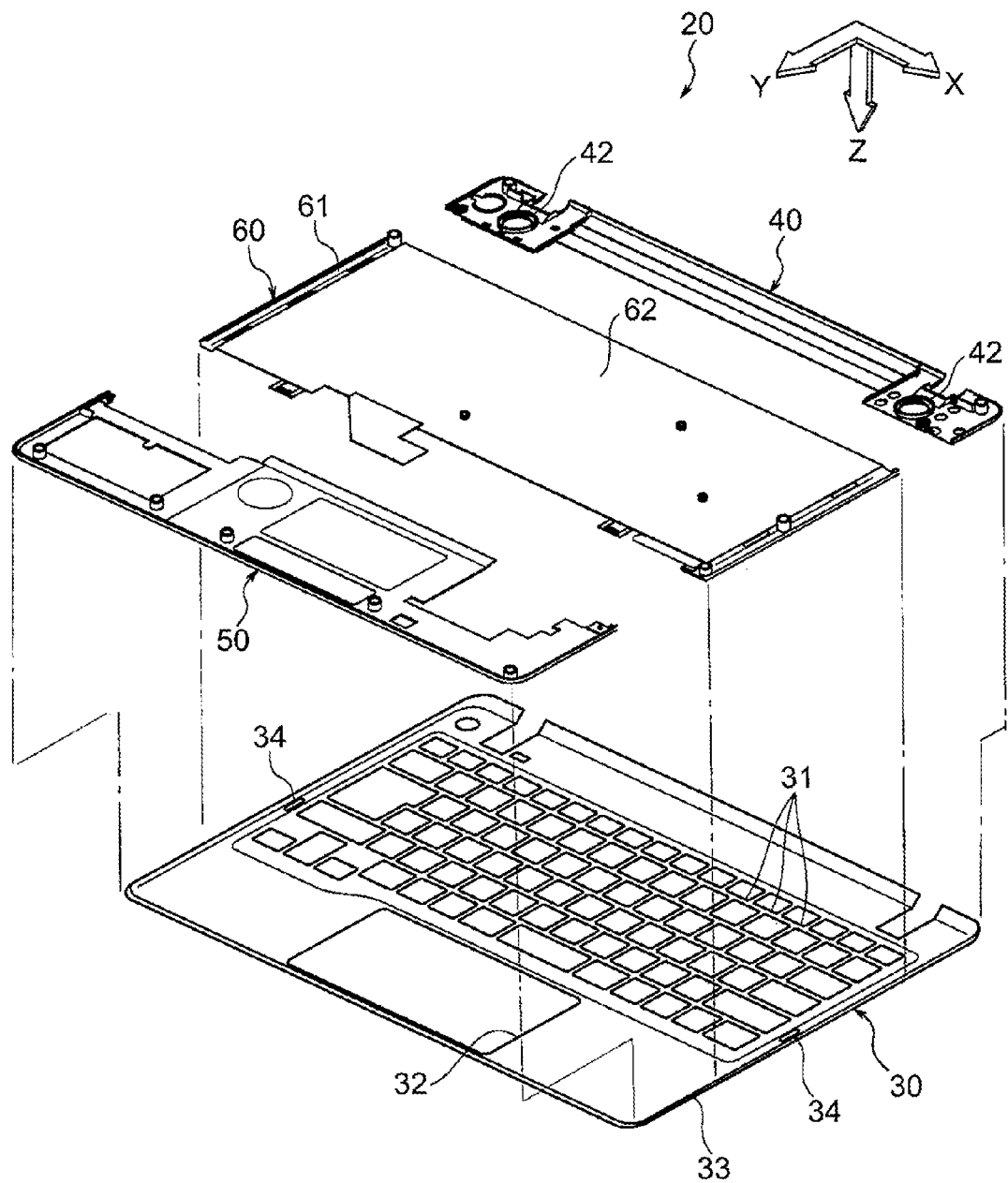
FIG. 3 is an exploded perspective view of the upper cover assembly.

As illustrated in FIG. 2 and FIG. 3, the upper cover assembly 20 has an upper cover 30 that is formed of metal, plural internal structural parts 40, 50, 61 that are formed of resin, and a keyboard unit 62.

Figure 4:
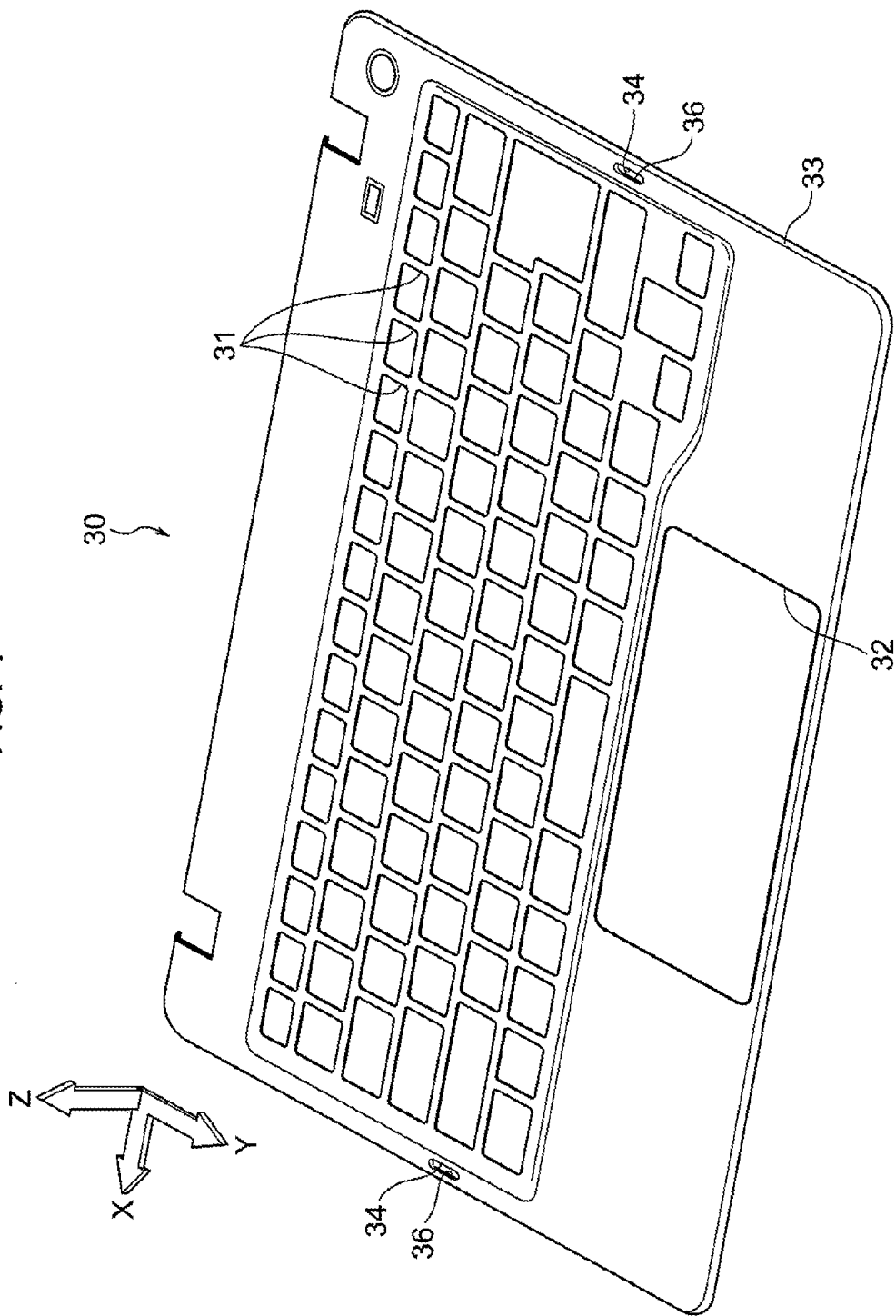
FIG. 4 is a perspective view of an upper cover.

The upper cover 30 is an example of a casing, and is formed by press molding. As illustrated in FIG. 3 and FIG. 4, plural openings 31 for exposing plural keys 63 that are described later, an opening 32 for exposing an unillustrated touch pad or the like, and the like are formed in the upper cover 30. The plural openings 31 are formed to sizes that correspond respectively to the plural keys 63. Further, the upper cover 30 is formed in a rectangular shape in plan view, and a side wall portion 33 is formed at the periphery thereof.

Figure 5:
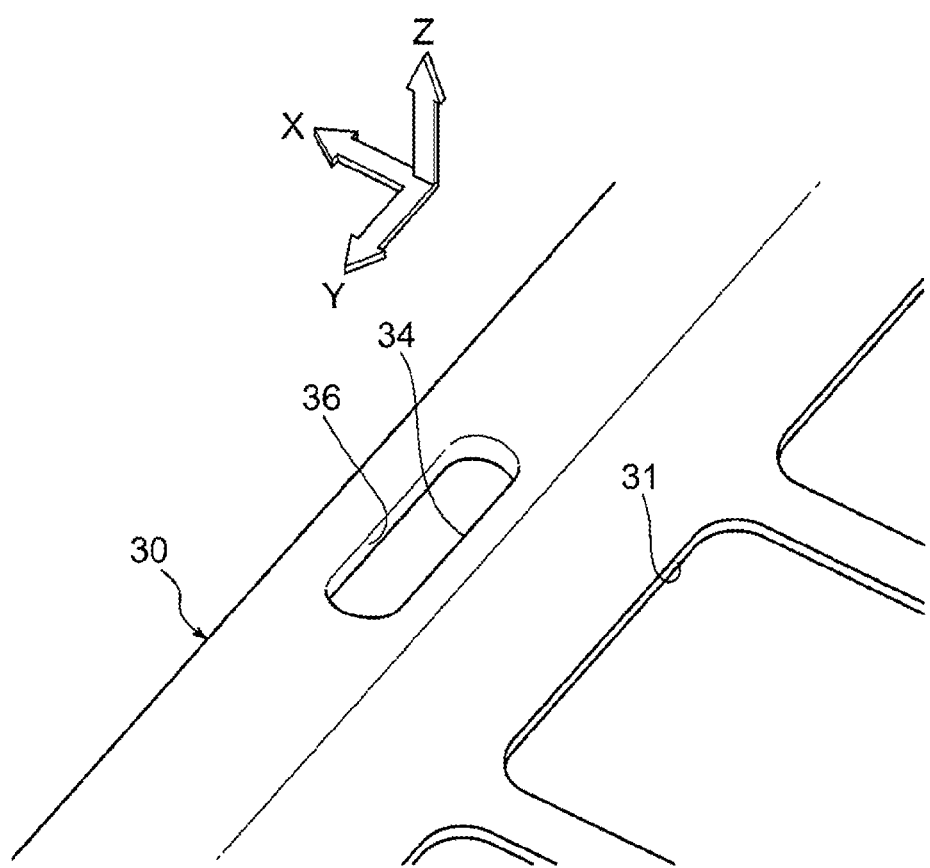
FIG. 5 is an enlarged view of a main portion of FIG. 4.

Positioning holes 34 are respectively formed in the lengthwise edge portions at both sides, in the lateral direction, of the upper cover 30. The positioning holes 34 are formed in the shapes of long holes that extend in the lengthwise direction of the upper cover 30. Further, the positioning holes 34 are formed at the time of press molding of the upper cover 30. As illustrated in FIG. 5, rising walls 36, that project-out at the inner side of the upper cover 30, are formed by burring processing at the peripheries of these positioning holes 34.

Figure 6:
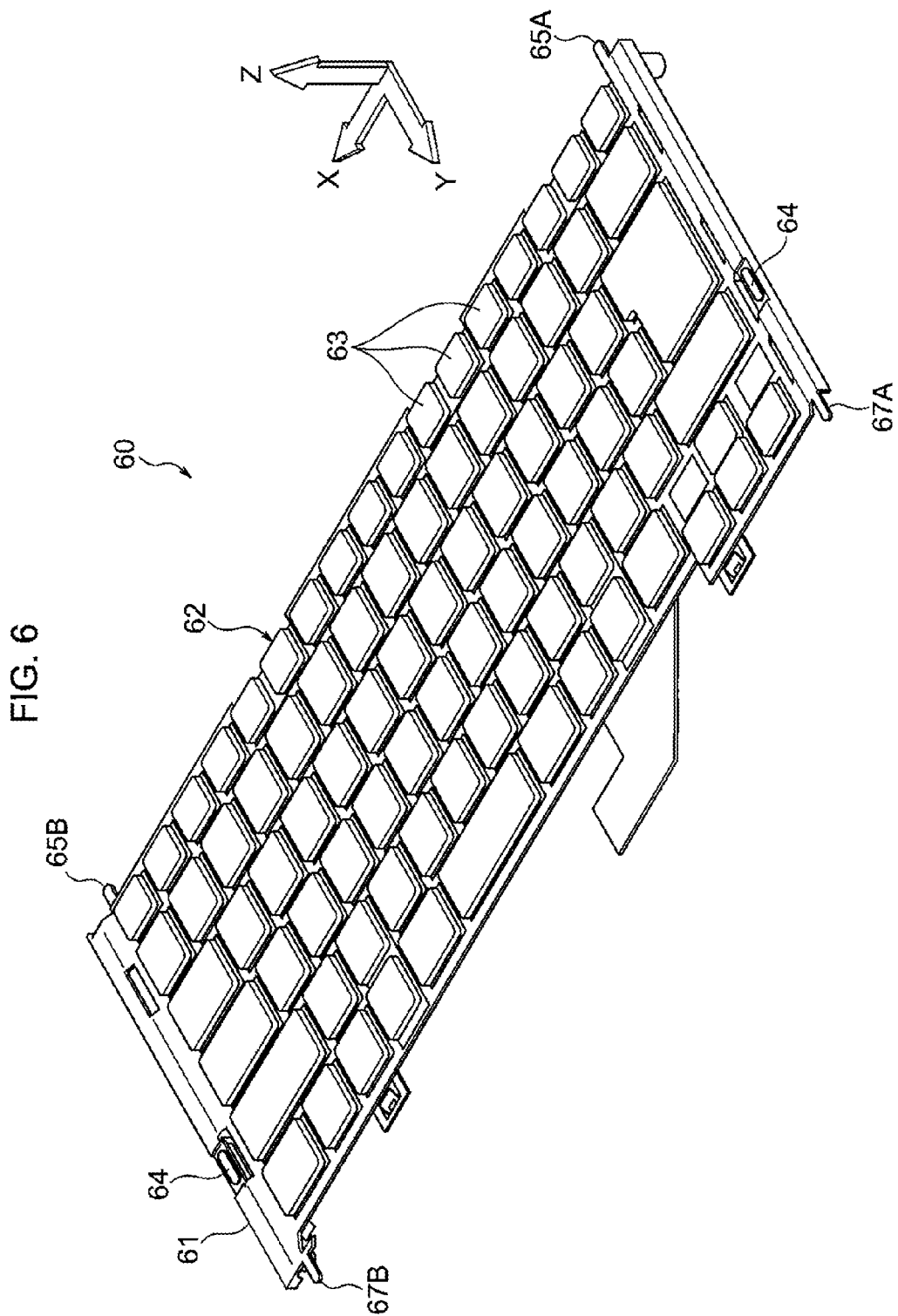
FIG. 6 is a perspective view of a keyboard assembly.

As illustrated in FIG. 6, the internal structural part 61 is assembled, by welding or the like for example, integrally with the keyboard unit 62 that has the plural keys 63. The internal structural part 61, together with the keyboard unit 62, forms a keyboard assembly 60. The keyboard assembly 60 is an example of a first assembly.

Figure 7:
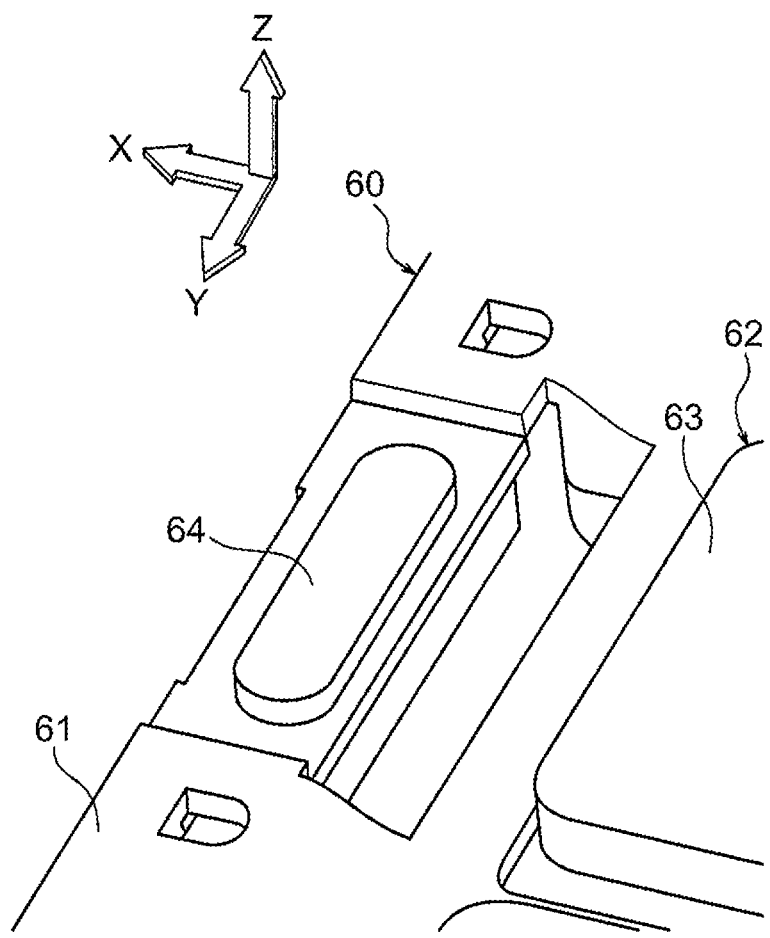
FIG. 7 is an enlarged view of a main portion of FIG. 6.
Figure 8:
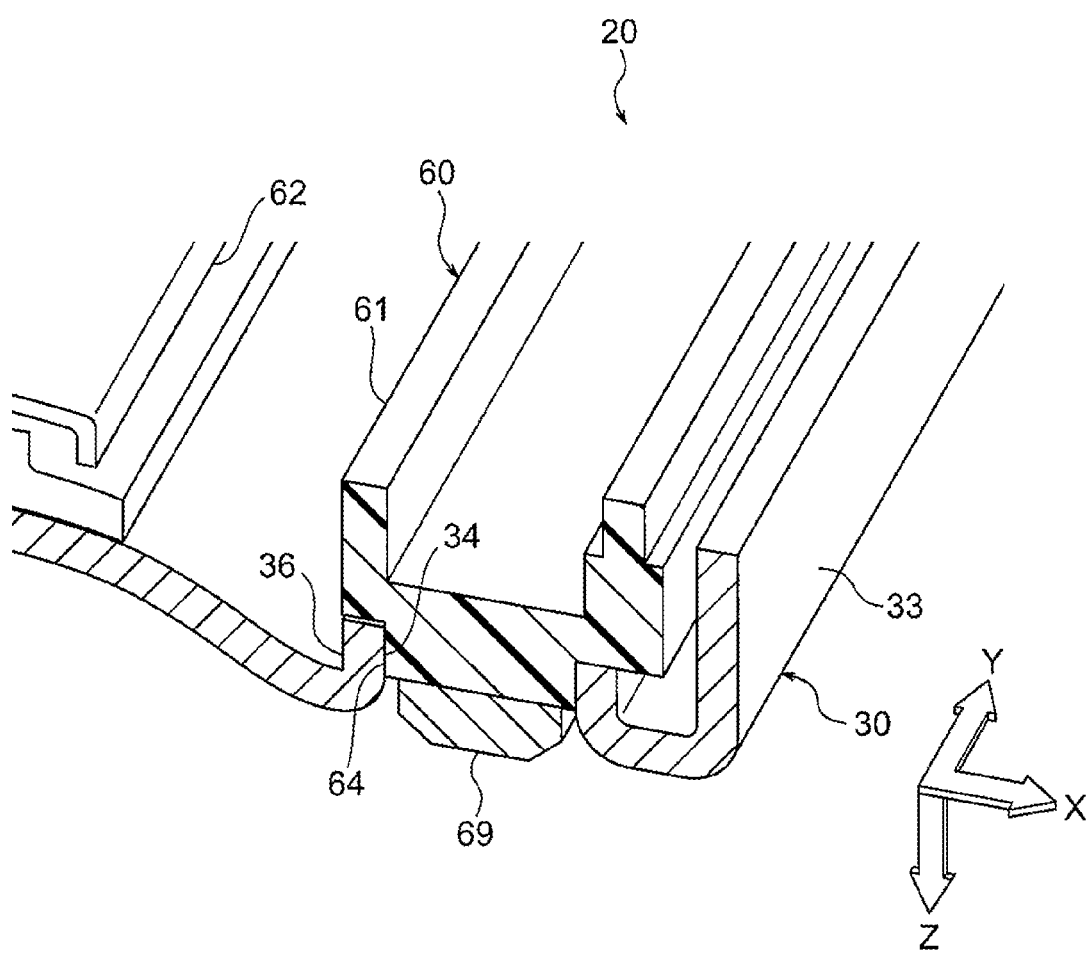
FIG. 8 is an enlarged view of a main portion, illustrating a state in which the keyboard assembly is assembled to the upper cover.

As illustrated in FIG. 6 and FIG. 7, positioning projections 64 are formed at the keyboard assembly 60 at positions corresponding to the positioning holes 34. The positioning projections 64 are formed integrally with the internal structural part 61, and are respectively provided at regions further toward the lateral direction both sides than the plural keys 63 at the keyboard assembly 60. As illustrated in FIG. 8, the positioning projection 64 engages with the positioning hole 34, and, in the same way as the positioning hole 34, is formed with the longitudinal direction thereof being the lengthwise direction of the keyboard assembly 60.

Further, as illustrated in FIG. 2 and FIG. 3, the keyboard assembly 60 is disposed so as to be offset, in the lengthwise direction of the upper cover 30, with respect to the internal structural parts 40, 50 that are described later. Namely, the keyboard assembly 60 is disposed between the internal structural part 40 and the internal structural part 50 in the lengthwise direction of the upper cover 30. The internal structural part 40 and the internal structural part 50 are each an example of a second assembly.

Figure 9:
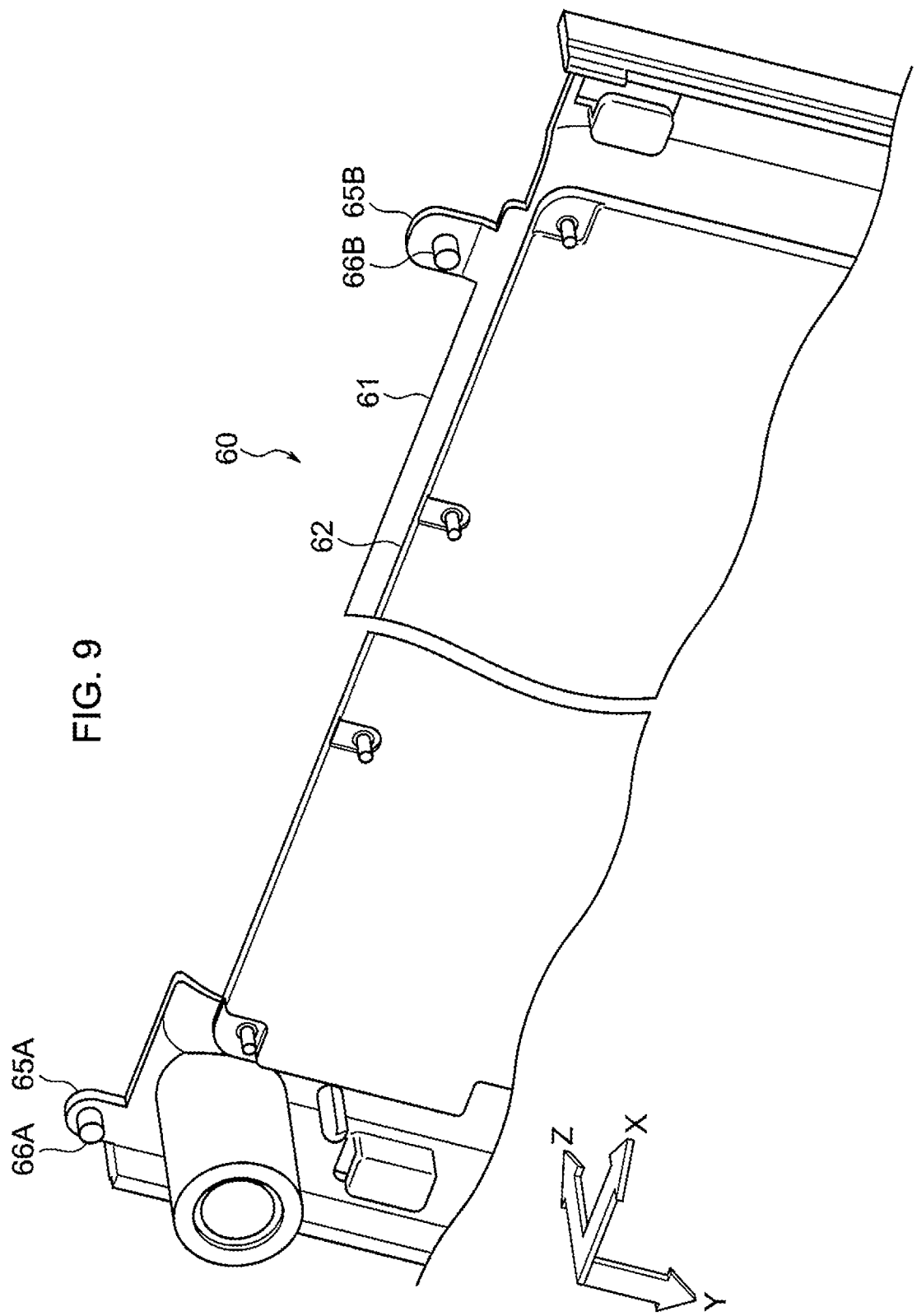
FIG. 9 is an enlarged view of main portions of the keyboard assembly.

A pair of extending portions 65A, 65B (see FIG. 9), that extend toward the inner structural part 40 side, are formed at the edge portion, at the internal structural part 40 side, of the keyboard assembly 60. As illustrated in FIG. 9, this pair of extending portions 65A, 65B are formed integrally with the internal structural part 61, and are respectively provided at regions at the lateral direction both sides of the keyboard assembly 60. Engaging projections 66A, 66B, that are circular in cross-section, are formed at the distal ends of the pair of extending portions 65A, 65B, respectively. These engaging projections 66A, 66B are examples of engaged portions.

Figure 10:
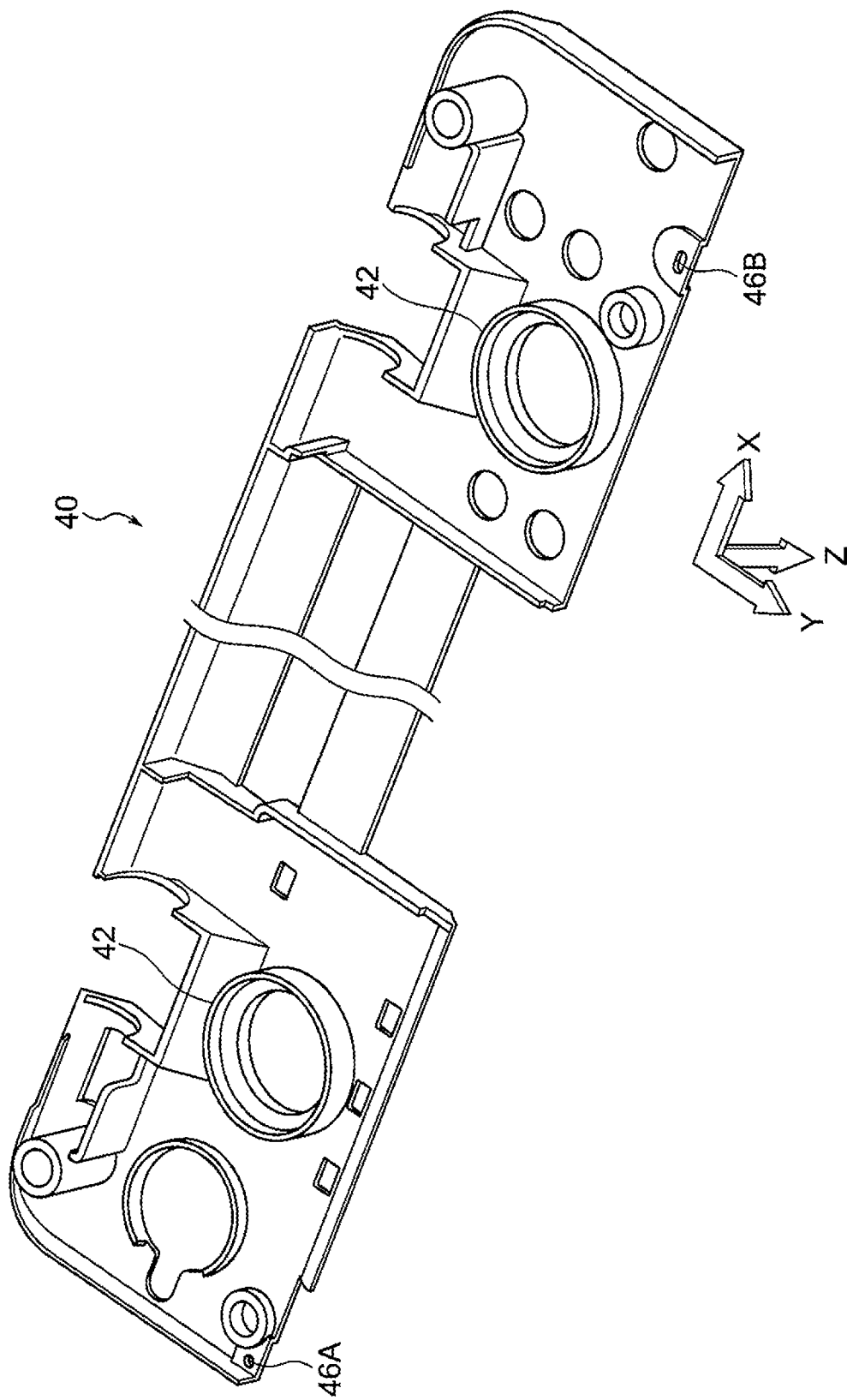
FIG. 10 is a perspective view of an internal structural part.

As illustrated in FIG. 10, the internal structural part 40 has plural holding portions 42 for holding functional parts such as unillustrated switches, speakers, or the like. Engaging holes 46A, 46B are formed in the internal structural part 40 at positions corresponding to the engaging projections 66A, 66B, respectively. Namely, the engaging holes 46A, 46B are provided at regions at the lateral direction both sides of the internal structural part 40. This pair of engaging holes 46A, 46B are examples of engaging portions respectively.

Figure 11:
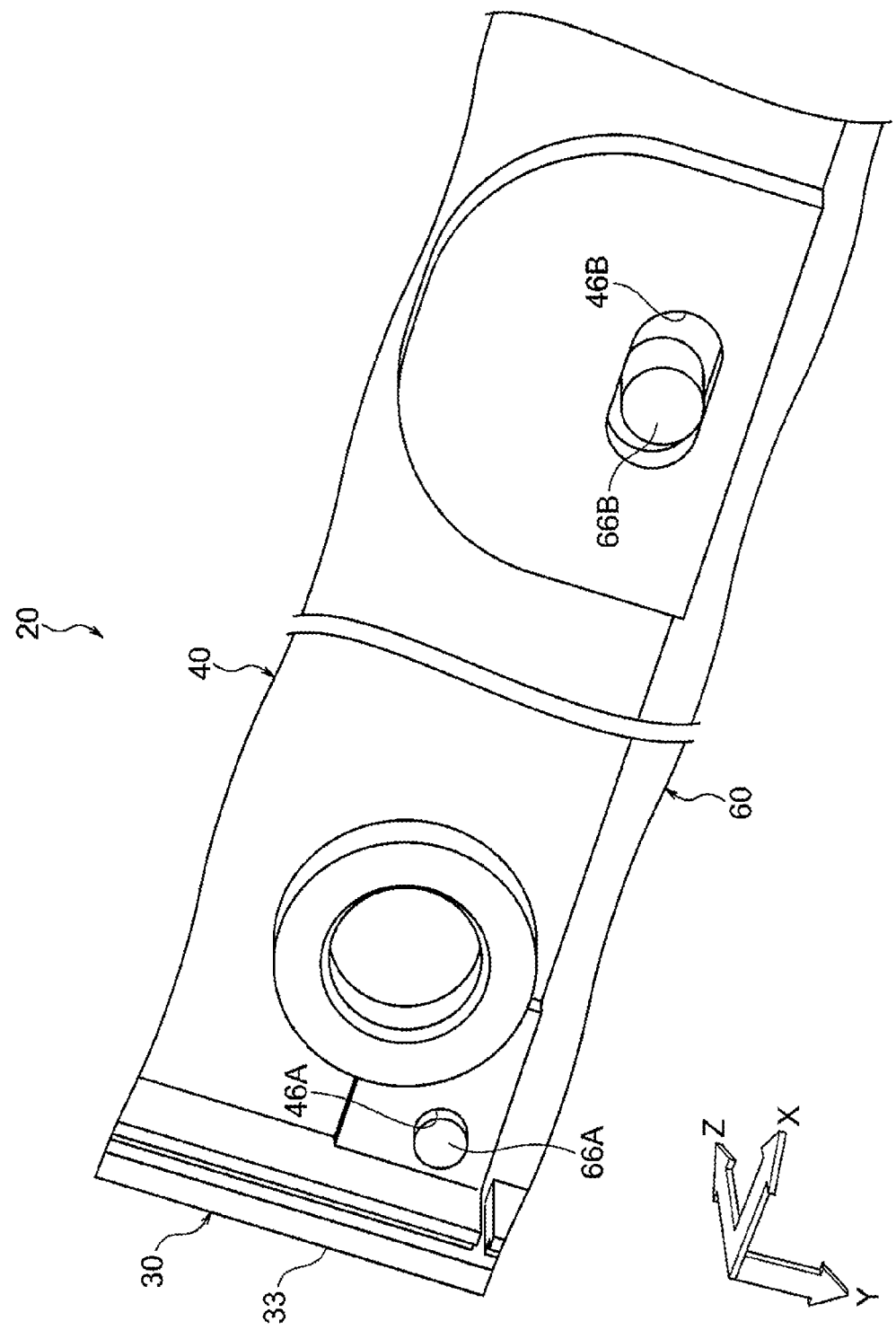
FIG. 11 is an enlarged view of main portions, illustrating a state in which the internal structural part is assembled to the keyboard assembly.

As illustrated in FIG. 11, the one engaging hole 46A is formed so as to be circular in cross-section, and is engaged with the engaging projection 66A. On the other hand, the other engaging hole 46B is formed in the shape of a long hole that extends in the lateral direction of the internal structural part 40, and is engaged with the engaging projection 66B.

Figure 12:
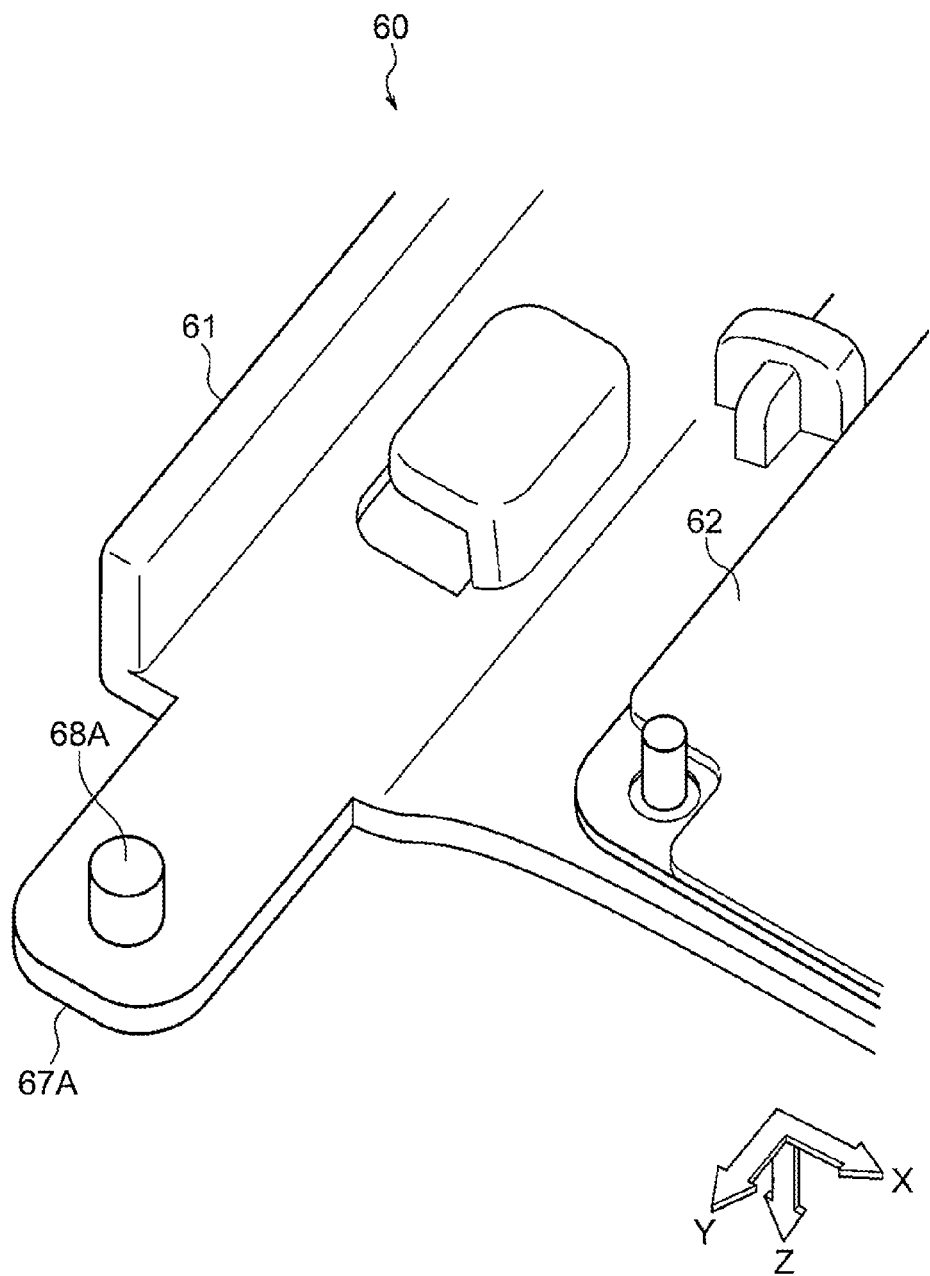
FIG. 12 is an enlarged view of a main portion of the keyboard assembly.
Figure 15:
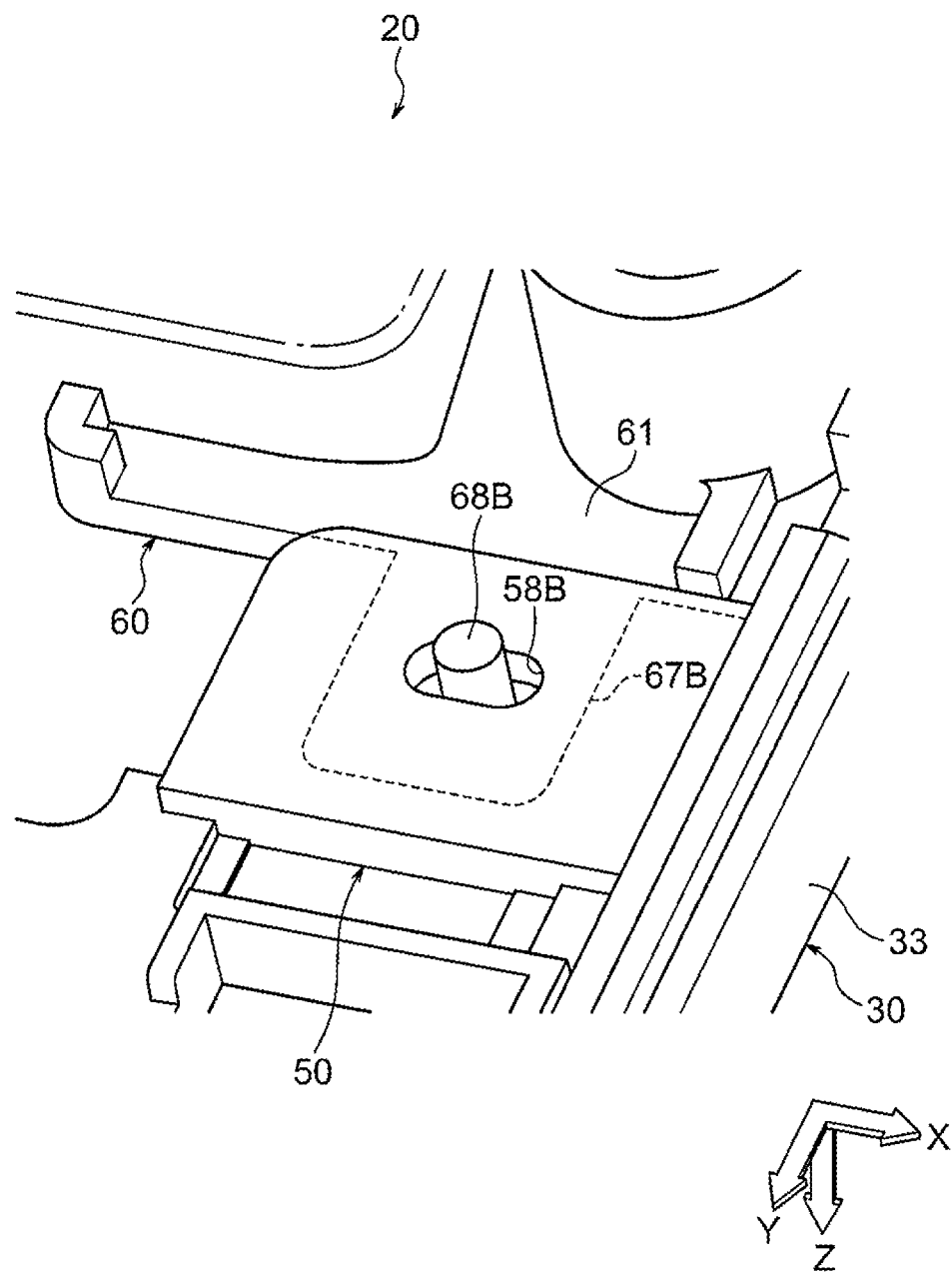
FIG. 15 is an enlarged view of a main portion, illustrating a state in which the other internal structural part is assembled to the keyboard assembly.

Further, as illustrated in FIG. 12 and FIG. 15, a pair of extending portions 67A, 67B, that extend toward the inner structural part 50 side, are formed at the edge portion, at the internal structural part 50 side, of the keyboard assembly 60. This pair of extending portions 67A, 67B are formed integrally with the internal structural part 61, and are respectively provided at regions at the lateral direction both sides of the keyboard assembly 60. Engaging projections 68A, 68B, that are circular in cross-section, are formed at the distal ends of the pair of extending portions 67A, 67B, respectively. These engaging projections 68A, 68B are examples of engaged portions.

Figure 13:
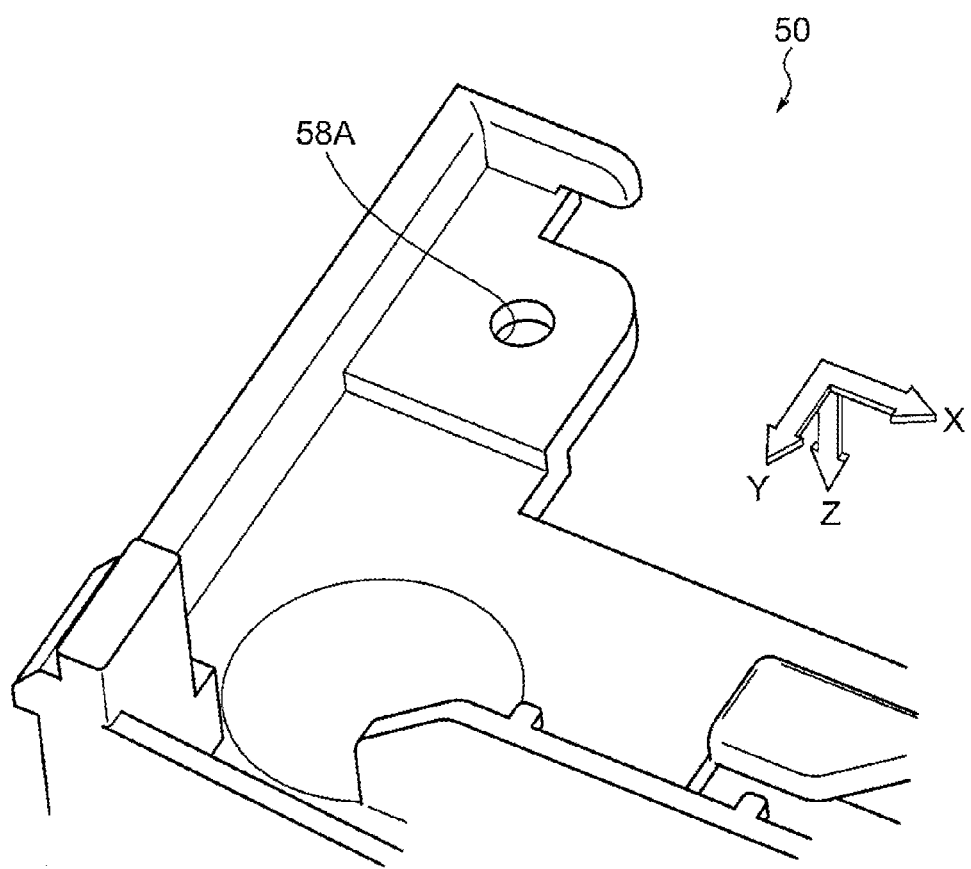
FIG. 13 is an enlarged view of a main portion of another internal structural part.
Figure 14:
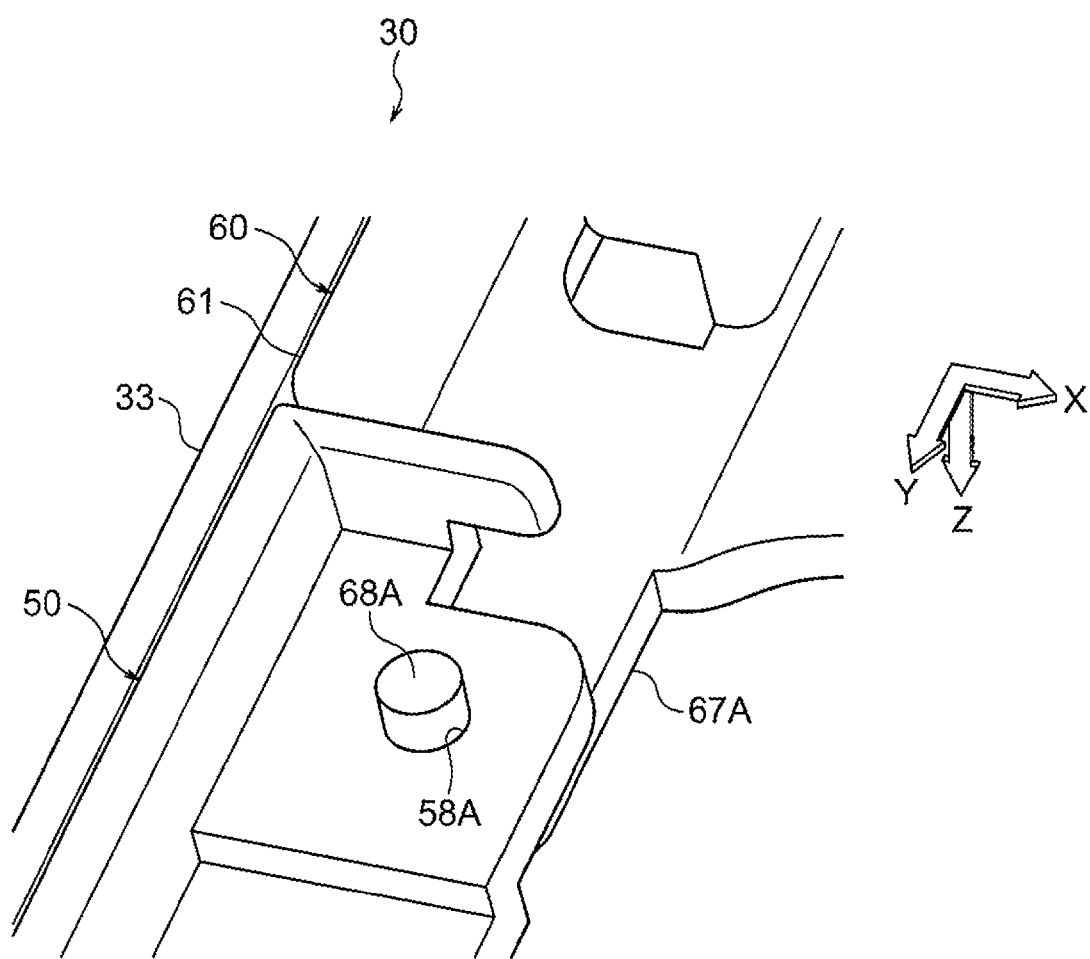
FIG. 14 is an enlarged view of a main portion, illustrating a state in which the other internal structural part is assembled to the keyboard assembly.

The internal structural part 50 illustrated in FIG. 13 through FIG. 15 has plural holding portions for holding functional parts such as, for example, a touch pad and the like (neither the holding portions nor the functional parts are illustrated). Engaging holes 58A, 58B are formed in the internal structural part 50 at positions corresponding to the engaging projections 68A, 68B, respectively. Namely, the engaging holes 58A, 58B are provided at regions at the lateral direction both sides of the internal structural part 50. This pair of engaging holes 58A, 58B are examples of engaging portions respectively.

As illustrated in FIG. 13 and FIG. 14, the one engaging hole 58A is formed so as to be circular in cross-section, and is engaged with the engaging projection 68A. On the other hand, as illustrated in FIG. 15, the other engaging hole 58B is formed in the shape of a long hole that extends in the lateral direction of the internal structural part 50, and is engaged with the engaging projection 68B.

As illustrated in FIG. 8, at this upper cover assembly 20, the keyboard assembly 60 is positioned at the upper cover 30 due to the positioning projections 64 being inserted into the positioning holes 34. Further, in the state in which the keyboard assembly 60 is positioned at the upper cover 30 in this way, the keyboard assembly 60 is assembled to the inner side of the upper cover 30 by unillustrated fixing members or the like.

As illustrated in FIG. 11, the internal structural part 40 is positioned at the keyboard assembly 60 due to the engaging projections 66A, 66B being engaged with the pair of engaging holes 46A, 46B, respectively. Further, in the state in which the internal structural part 40 is positioned at the keyboard assembly 60 in this way, the internal structural part 40 is assembled to the inner side of the upper cover 30 by unillustrated fixing members or the like.

Similarly, as illustrated in FIG. 14 and FIG. 15, the internal structural part 50 is positioned at the keyboard assembly 60 due to the engaging projections 68A, 68B being engaged with the pair of engaging holes 58A, 58B, respectively. Further, in the state in which the internal structural part 50 is positioned at the keyboard assembly 60 in this way, the internal structural part 50 is assembled to the inner side of the upper cover 30 by unillustrated fixing members or the like.

Moreover, as illustrated in FIG. 8, buffer portions 69, that are formed of an elastic material such as rubber or the like for example, are mounted to the distal ends of the positioning projections 64. These buffer portions 69 project-out from the positioning holes 34 to the obverse side of the upper cover 30. When the display portion 14 is set in the stored state in which the display portion 14 is folded-down so as to be superposed on the main body portion 16, the buffer portions 69 are pushed by the display portion 14. The buffer portions 69 are formed to be substantially the same sizes and shapes as the positioning holes 34.

Operation and effects of the present embodiment are described next.

As described in detail above, in the present embodiment, the positioning holes 34 are formed in the upper cover 30 that is formed by press molding, and the positioning projections 64 are formed at the keyboard assembly 60. Due to the positioning projections 64 being inserted into the positioning holes 34, the keyboard assembly 60 is assembled to the inner side of the upper cover 30 in a state of being positioned thereat.

Further, the engaging projections 66A, 66B and the engaging projections 68A, 68B are formed at the keyboard assembly 60, and the engaging holes 46A, 46B and the engaging holes 58A, 58B are formed in the internal structural parts 40, 50, respectively. Due to the engaging projections 66A, 66B being engaged with the engaging holes 46A, 46B, the internal structural part 40 is assembled to the inner side of the upper cover 30 in a state of being positioned at the keyboard assembly 60. Similarly, due to the engaging projections 68A, 68B being engaged with the engaging holes 58A, 58B, the internal structural part 50 is assembled to the inner side of the upper cover 30 in a state of being positioned at the keyboard assembly 60.

In this way, in accordance with the present embodiment, the keyboard assembly 60 and the internal structural parts 40, 50 can be assembled to the upper cover 30 in positioned states, without using a jig. Due thereto, costs for jigs are obviated, and therefore, the cost of the electronic apparatus can be reduced. Further, because work processes for setting jigs also can be done away with, costs can be reduced for this reason as well.

Further, the mounting holes for mounting the buffer portions 69 are used as the positioning holes 34 that are used in positioning the keyboard assembly 60 and the upper cover 30. Due thereto, the structure of the upper cover 30 can be simplified, and the appearance of the upper cover 30 can be ensured.

Moreover, the rising walls 36 that project-out at the inner sides of the upper cover 30 are formed by burring processing at the peripheries of the positioning holes 34. Accordingly, the dimensions, in the height direction, of the positioning holes 34 can be ensured, and therefore, the accuracy of positioning the positioning holes 34 and the positioning projections 64 can be improved.

Further, the engaging projections 66A, 66B and the engaging holes 46A, 46B are provided at regions at both sides in the lateral direction at the keyboard assembly 60 and the internal structural part 40. Of the pair of engaging holes 46A, 46B, the engaging hole 46B is formed in the shape of a long hole that extends in the lateral direction of the internal structural part 40. Accordingly, the engaging projections 66A, 66B and the engaging holes 46A, 46B can be engaged together while the dimensional error between the pair of engaging projections 66A, 66B is absorbed.

Similarly, the engaging projections 68A, 68B and the engaging holes 58A, 58B are provided at regions at both sides in the lateral direction at the keyboard assembly 60 and the internal structural part 50. Of the pair of engaging holes 58A, 58B, the engaging hole 58B is formed in the shape of a long hole that extends in the lateral direction of the internal structural part 50. Accordingly, the engaging projections 68A, 68B and the engaging holes 58A, 58B can be engaged together while the dimensional error between the pair of engaging projections 68A, 68B is absorbed.

Further, the keyboard assembly 60 is positioned at the upper cover 30 by the positioning projections 64 and the positioning holes 34, earlier than the internal structural parts 40, 50 are positioned. Accordingly, the positional accuracy of the keyboard assembly 60 and the upper cover 30, and accordingly the positional accuracy of the plural keys 63 and the plural openings 31, can be ensured.

In particular, the positioning projections 64 are respectively provided at regions, that are further toward the lateral direction both sides than the plural keys 63, at the keyboard assembly 60. Therefore, the positional accuracy of the plural keys 63 and the plural openings 31 can be improved.

Modified examples of the present embodiment are described next.

In the above-described embodiment, the electronic apparatus 10 is made to be a notebook personal computer, but the electronic apparatus 10 may be another electronic apparatus.

Further, in the above-described embodiment, the keyboard assembly 60 is first assembled to the inner side of the upper cover 30 in a state of being positioned thereat, and thereafter, the internal structural parts 40, 50 are assembled to the inner side of the upper cover 30 in states of being positioned at the keyboard assembly 60. However, the internal structural parts 40, 50 may first be assembled to the inner side of the upper cover 30 in states of being positioned thereat, and thereafter, the keyboard assembly 60 may be assembled to the inner side of the upper cover 30 in a state of being positioned at the internal structural parts 40, 50.

Note that, in this case, the internal structural parts 40, 50 are examples of the first assembly, and the keyboard assembly 60 is an example of the second assembly. Further, in this case, the positioning projections 64 are formed at at least one of the internal structural part 40 and the internal structural part 50. Moreover, in this case, the engaging holes 46A, 46B, 58A, 58B that are formed in the internal structural parts 40, 50 are examples of engaged portions, and the engaging projections 66A, 66B, 68A, 68B that are formed at the keyboard assembly 60 are examples of engaging portions.

Further, although the electronic apparatus 10 is provided with the three internal structural parts 40, 50, 61 in the above-described embodiment, the number of the internal structural parts may be other than three.

Moreover, in the electronic apparatus 10, the upper cover 30 is an example of the casing, the keyboard assembly 60 is an example of the first assembly, and the internal structural parts 40, 50 are examples of the second assembly. However, members other than these may be made to be the casing, the first assembly and the second assembly.

Figure 16:
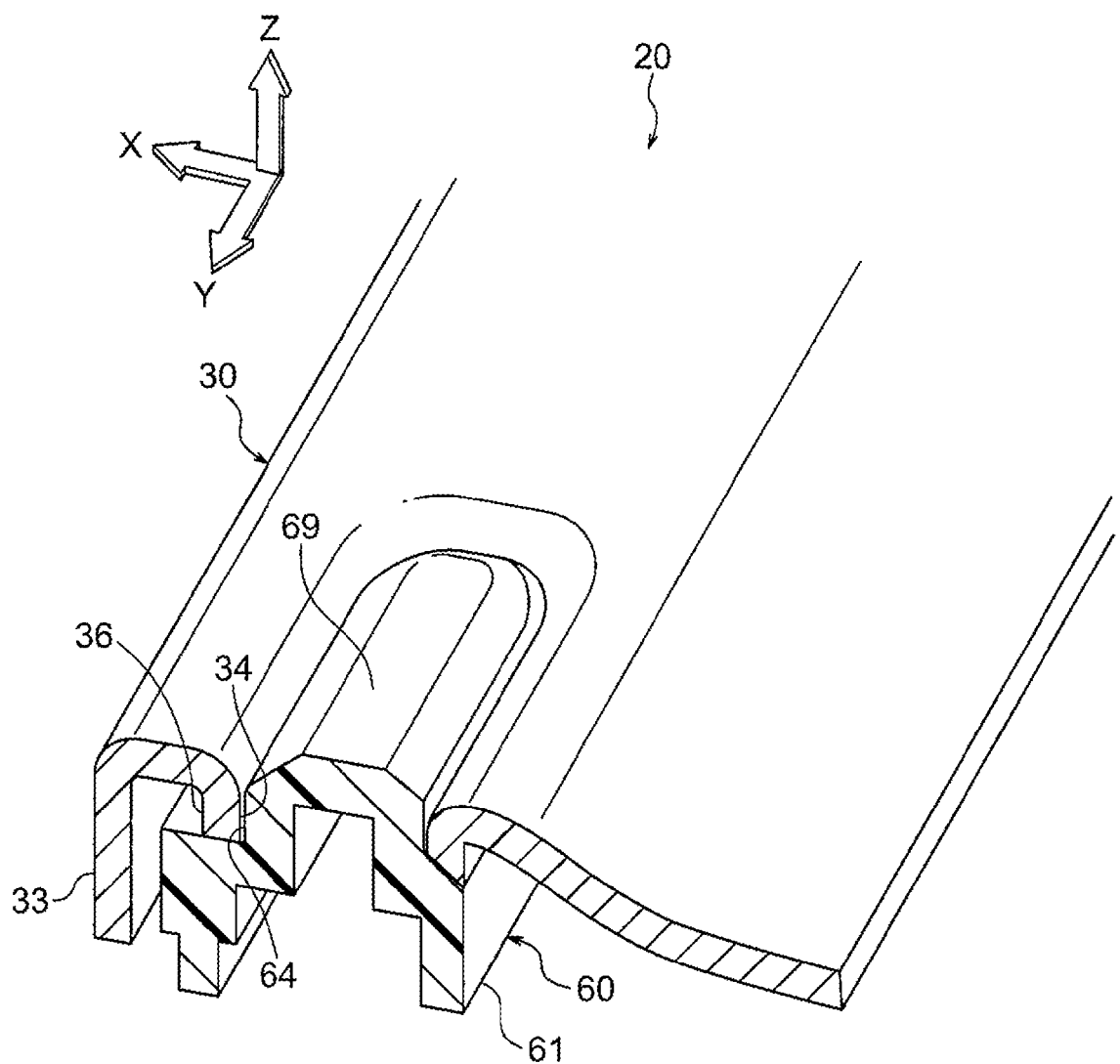
FIG. 16 is an enlarged view of a main portion, illustrating a modified example of a positioning projection.

Further, although the buffer portions 69 are made to be bodies that are separate from the positioning projections 64 and are mounted to the distal ends of the positioning projections 64, as illustrated in FIG. 16, the distal ends of the positioning projections 64 may be formed as the buffer portions 69 that project-out from the positioning holes 34. Namely, the buffer portions 69 may be formed integrally with the positioning projections 64.

Still further, in the above-described embodiment, the engaging projections 66A, 66B, 68A, 68B are formed at the keyboard assembly 60 as examples of engaged portions, and the engaging holes 46A, 46B, 58A, 58B are formed in the internal structural parts 40, 50 as examples of engaging portions. However, other than this, for example, engaging holes may be formed in the keyboard assembly 60 as examples of engaged portions, and engaging projections may be formed at the internal structural parts 40, 50 as examples of engaging portions. Further, in this case, either one of the pair of engaging holes that are formed at the keyboard assembly 60 may be formed in the shape of a long hole that extends in the lateral direction of the keyboard assembly 60.

Note that the above-described plural modified examples can be implemented by being combined appropriately.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic apparatus comprising:
   a casing that is formed by press molding and that has positioning holes;

a first assembly having positioning projections that are inserted into the positioning holes and at whose distal ends are provided buffer portions that project-out from the positioning holes, the first assembly being assembled to an inner side of the casing in a positioned state due to the positioning projections being inserted into the positioning holes; and a second assembly having engaging portions, and being assembled to the inner side of the casing in a state of being positioned at the first assembly, due to the engaging portions being engaged with engaged portions that are formed at the first assembly.

2. The electronic apparatus of claim 1, wherein rising walls, that project-out at the inner side of the casing, are formed by burring processing at peripheries of the positioning holes.

3. The electronic apparatus of claim 1, wherein
the engaged portions and the engaging portions are provided at regions at both sides, in a laterally transverse direction, at the first assembly and the second assembly respectively, and
one of a pair of the engaged portions, or one of a pair of the engaging portions, is formed in a shape of a long hole that extends in the laterally transverse direction.

4. The electronic apparatus of claim 1, wherein the first assembly is a keyboard assembly having a keyboard unit.

5. The electronic apparatus of claim 4, wherein the positioning projections are provided respectively at regions that are further toward laterally transverse direction both sides than a plurality of keys at the keyboard assembly.

6. The electronic apparatus of claim 1, wherein the buffer portions are provided as bodies separate from the positioning projections, and are mounted to the distal ends of the positioning projections.

7. The electronic apparatus of claim 1, wherein
the electronic apparatus is a notebook personal computer that includes a display portion having a monitor, and a main body portion having a keyboard unit, and
the casing is an upper cover that is provided at the main body portion.

8. The electronic apparatus of claim 7, wherein a plurality of openings, that are formed to sizes corresponding respectively to a plurality of keys provided at the keyboard unit and that expose the plurality of keys, are formed in the upper cover.

* * * * *